United States Patent [19]

Kurtz et al.

[11] Patent Number: 5,625,635
[45] Date of Patent: Apr. 29, 1997

[54] INFRARED EMITTING DEVICE AND METHOD

[75] Inventors: Steven R. Kurtz; Robert M. Biefeld; L. Ralph Dawson; Arnold J. Howard; Kevin C. Baucom, all of Albuquerque, N.M.

[73] Assignee: Sandia Corporation

[21] Appl. No.: 345,160

[22] Filed: Nov. 28, 1994

[51] Int. Cl.$^6$ .................................................. H01S 3/19
[52] U.S. Cl. ............................. 392/45; 257/22; 257/103
[58] Field of Search ........................ 372/43, 45; 257/22, 257/103

[56] References Cited

U.S. PATENT DOCUMENTS

| | | | |
|---|---|---|---|
| 4,184,171 | 1/1980 | Panish | 372/45 |
| 4,207,122 | 6/1980 | Goodman | 372/45 |
| 4,918,496 | 4/1990 | Matsushima | 357/17 |
| 5,251,225 | 10/1993 | Eglash | 372/45 |

OTHER PUBLICATIONS

Agrawal and Dutta, Semiconductor Lasers Second Edition, Van Nostrand Reinhold, New York, pp. 455–456 1993.

Agrawal and Dutta, Semiconductor Lasers Second Edition, Van Nostrand Reinhold, New York, pp. 450–454 1993.

Agrawal and Dutta, Semiconductor Lasers Second Edition, Van Nostrand Reinhold, New York, pp. 462–467 1993.

R. M. Biefeld, S. R. Kurtz, L. R. Dawson, and G. C. Osbourn, "The Preparation and Infrared Properties of In(AsSb) Strained–Layer Superlattices," *Crystal Properties & Preparation*, vol. 21, pp. 141–164, 1989 (no month available).

R. M. Biefeld, K. C. Baucom, S. R. Kurtz, and D. M. Follstaedt, "The Growth of $InP_{1-x}Sb_x$ by Metalorganic Chemical Vapor Deposition," *Journal of Crystal Growth*, vol. 133, pp. 38–46, 1993 (no month available).

R. M. Biefeld, K. C. Baucom, S. R. Kurtz, and D. M. Follstaedt, "The Growth of InAsSb/InGaAs Strained–Layer Superlattices by Metal–Organic Chemical Vapor Deposition," *Materials Research Society Symposium Proceedings*, vol. 325, pp. 493–498, 1994 (no month available).

S. R. Kurtz, R. M. Biefeld, L. R. Dawson, K. C. Baucom, and A. J. Howard, "Midwave (4 μm) Infrared Lasers and Light–Emitting Diodes with Biaxially Compressed InAsSb Active Regions," *Applied Physics Letters*, vol. 64, pp. 812–814, 14 Feb. 1994.

(List continued on next page.)

*Primary Examiner*—Rodney B. Bovernick
*Assistant Examiner*—Yisun Song
*Attorney, Agent, or Firm*—John P. Hohimer

[57] ABSTRACT

An infrared emitting device and method. The infrared emitting device comprises a III-V compound semiconductor substrate upon which are grown a quantum-well active region having a plurality of quantum-well layers formed of a ternary alloy comprising InAsSb sandwiched between barrier layers formed of a ternary alloy having a smaller lattice constant and a larger energy bandgap than the quantum-well layers. The quantum-well layers are preferably compressively strained to increase the threshold energy for Auger recombination; and a method is provided for determining the preferred thickness for the quantum-well layers. Embodiments of the present invention are described having at least one cladding layer to increase the optical and carrier confinement in the active region, and to provide for waveguiding of the light generated within the active region. Examples have been set forth showing embodiments of the present invention as surface- and edge-emitting light emitting diodes (LEDs), an optically-pumped semiconductor laser, and an electrically-injected semiconductor diode laser. The light emission from each of the infrared emitting devices of the present invention is in the midwave infrared region of the spectrum from about 2 to 6 microns.

8 Claims, 7 Drawing Sheets

OTHER PUBLICATIONS

S. R. Kurtz, R. M. Biefeld, and L. R. Dawson, "Modification of Valence–Band Symmetry and Auger–1 Threshold Energy in Biaxially Compressed InAsSb," *Physical Review B*, to be published (no date available).

N. K. Dutta, "Calculation of Auger Rates in a Quantum Well Structure and Its Application to InGaAsP Quantum Well Lasers," *Journal of Applied Physics*, vol. 54, pp. 1236–1245, Mar. 1983.

J. P. van der Ziel, T. H. Chiu, and W. T. Tsang, "Optically Pumped Laser Oscillation at 3.9μm from $Al_{0.5}Ga_{0.5}Sb$/$InAs_{0.91}Sb_{0.09}$/$Al_{0.5}Ga_{0.5}Sb$ Double Heterostructures Grown by Molecular Beam Epitaxy on GaSb," *Applied Physics Letters*, vol. 48, pp. 315–317, 3 Feb. 1986.

A. R. Adams, "Band–Structure Engineering for Low–Threshold High–Efficiency Semiconductor Lasers," *Electronics Letters*, vol. 22, pp. 249–250, 27 Feb. 1986.

E. Yablonovitch and E. O. Kane, "Band Structure Engineering of Semiconductor Lasers for Optical Communications," *IEEE Journal of Lightwave Technology*, vol. 6, pp. 1292–1299, Aug., 1988.

H. Mani and A. Joullie, "Some Characteristics of 3.2μm Injection Lasers Based on InAsSb/InAsSbP System," *SPIE Proceedings: Physical Concepts of Materials for Novel Optoelectronic Device Applications* [SPIE, Bellingham, WA], vol. 1362, pp. 38–48, 1990 (no month available).

R. J. Menna, D. R. Capewell, R. U. Martinelli, P. K. York, and R. E. Enstrom, "3.06μm InGaAsSb/InPSb Diode Lasers Grown by Organometallic Vapor–Phase Epitaxy," *Applied Physics Letters*, vol. 59, pp. 2127–2129, 21 Oct. 1991.

H. K. Choi and S. J. Eglash, "High–Power Multiple–Quantum–Well GaInAsSb/AlGaAsSb Diode Lasers Emitting at 2.1 μm with Low Threshold Current Density," *Applied Physics Letters*, vol. 61, pp. 1154–1156, 7 Sep. 1992.

W. Dobbelaere, J. DeBoeck, C. Bruynseraede, R. Mertens, and G.Borghs, "InAsSb Light Emitting Diodes and Their Applications to Infra–Red Gas Sensors," *Electronics Letters*, vol. 29, pp. 890–891, 13 May 1993.

H. Q. Le, G. W. Turner, S. J. Eglash, H. K. Choi, and D. A. Coppeta, "High–Power Diode–Laser–Pumped InAsSb/GaSb and GaInAsSb/GaSb Lasers Emitting from 3 to 4 μm," *Applied Physics Letters*, vol. 64, pp. 152–154, 10 Jan. 1994.

S. J. Eglash and H. K. Choi, "InAsSb/AlAsSb Double–Heterostructure Diode Lasers Emitting at 4 μm," *Applied Physics Letters*, vol. 64, pp. 833–835, 14 Feb. 1994.

H. K. Choi, S. J. Eglash, and G. W. Turner, "Double–Heterostructure Diode Lasers Emitting at 3 μm with a Metastable GaInAsSb Active Layer and AlGaAsSb Cladding Layers," *Applied Physics Letters*, vol. 64, pp. 2472–2476, 9 May 1994.

Z. L. Liau and H. K. Choi, "$InAs_{1-x}Sb_x$/$In_{1-y}Ga_yAs$ Multiple–Quantum–Well Heterostructure Design for Improved 4–5 μm Lasers," *Applied Physics Letters*, vol. 64, pp. 3219–3221, 13 Jun. 1994.

H. K. Choi, G. W. Turner, and Z. L. Liau, "3.9–μm InAsSb/AlAsSb Double–Heterostructure Diode Lasers with High Output Power and Improved Temperature Characteristics," *Applied Physics Letters*, vol. 65, pp. 2251–2253, 31 Oct. 1994.

INFRARED EMITTING DEVICE AND METHOD

This invention was made with Government support under Contract No. DE-AC04-94AL85000 awarded by the U.S. Department of Energy. The Government has certain rights in the invention.

FIELD OF THE INVENTION

The present invention relates to a semiconductor infrared emitting device and method for use in a wavelength region from about 2 to 6 microns.

BACKGROUND OF THE INVENTION

Infrared emitting devices including semiconductor light emitting diodes and lasers operating in the midwave infrared region of the spectrum (defined herein as being a wavelength range of about 2 to 6 microns) have potential applications in many areas including fluoride-based optical-fiber communications, molecular spectroscopy, chemical and pollution sensing, process monitoring, and infrared laser radar and countermeasures.

In recent years, the art of III-V semiconductor light emitting devices has been advancing rapidly in the near-infrared region of the spectrum at wavelengths below about 1.5 microns. A lesser effort has been devoted to the development of III-V midwave infrared emitting devices, although such midwave emitters are expected to become increasingly important for the above applications.

Some prior art infrared emitters have been grown with III-V quaternary alloys for the active region and cladding layers surrounding the active region. In particular, U.S. Pat. No. 5,251,225 to Eglash et al discloses a quantum-well diode laser formed on a GaSb substrate with a quaternary active region of GaInAsSb quantum-wells separated by AlGaAsSb barrier layers, and quaternary AlGaAsSb cladding layers having a higher aluminum content than the barrier layers.

A disadvantage of using quaternary alloys for the formation of infrared emitting devices is that quaternary alloys are much more difficult to grow than ternary alloys.

Another disadvantage of the use the quaternary alloy GaInAsSb for the active region as in the Eglash et al patent is that this quaternary alloy is reported to have miscibility gaps that may limit the ability to fabricate infrared emitting devices at some midwave infrared wavelengths.

An advantage of the infrared emitting device and method of the present invention is that it is based on the growth of a ternary alloy active region, thereby simplifying epitaxial growth.

Another advantage of the present invention is that ternary alloys having layer compositions close to a III-V semiconductor substrate may be used, thereby providing for high-quality epitaxial growth.

Another advantage of the present invention is that the ternary alloys InAsSb and InGaAs have considerably lower binodal temperatures compared to the GaInAsSb quaternary alloys, making the ternary alloys suitable for the growth of homogeneous layer compositions at relatively low temperatures without phase segregation.

A further advantage of the present invention is that an active region of the infrared emitting device may be in the form of a strained-layer superlattice having a plurality of compressively-strained InAsSb quantum-well layers sandwiched between barrier layers formed of a semiconductor alloy having a smaller lattice constant and a larger energy bandgap than the quantum-well layers.

Still another advantage of the present invention is that a layer thickness of the compressively-strained InAsSb quantum-well layers may be selected to provide an increased activation energy for an Auger recombination process, thereby reducing an effect of the Auger process.

These and other advantages of the infrared emitting device and method of the present invention will become evident to those skilled in the art.

SUMMARY OF THE INVENTION

Accordingly, it is a primary object of the present invention to provide an infrared emitting device and method which overcomes the disadvantages of the prior art.

An additional object is to provide an infrared emitting device in the form of a light emitting diode.

A further object of the invention is to provide an infrared emitting device in the form of a laser.

Still another object of the invention is to provide an infrared emitting device for use in the 2–6 micron wavelength region.

An additional object of the invention is to provide an infrared emitting device that can be more simply and more accurately grown than prior an devices.

Another object of the invention is to reduce a deleterious effect of an Auger process in a midwave infrared emitting device by providing an active region comprising biaxially compressively-strained quantum-well layers and biaxially tensile-strained barrier layers, with the thickness of the quantum-well layers being selected to increase the energy required to initiate the Auger process.

A further object of the invention is to provide one or more compressively strained quantum-well layers in the active region for improved device performance, increasing the range of operating wavelength, efficiency, and temperature for the infrared emitting device.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, an infrared emitting device and a method for fabrication of the device to reduce an Auger effect are provided. The infrared emitting device comprises a III-V compound semiconductor substrate upon which are grown a quantum-well active region having a plurality of quantum-well layers formed of a ternary alloy comprising InAsSb sandwiched between barrier layers formed of a ternary alloy having a smaller lattice constant and a larger energy bandgap than the quantum-well layers. The quantum-well layers are preferably compressively strained to increase the threshold energy for an Auger recombination process, with the average lattice constant (defined herein as the lattice constant of the quantum-well alloy times the fraction of the total active layer thickness comprised of the quantum-well alloy plus the lattice constant of the barrier layer alloy times the fraction of the total active layer thickness comprised of the barrier layer alloy) of the active region preferably being lattice matched to the substrate. Embodiments of the present invention are described as an infrared light emitting diode (LED), an optically-pumped semiconductor laser, and a semiconductor diode laser.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
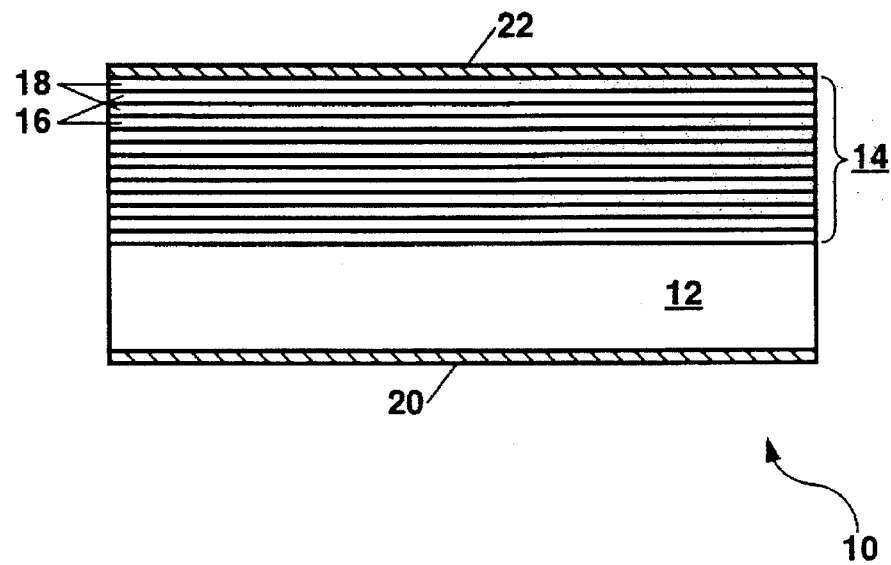
FIGS. 1a and 1b show schematic cross-section illustrations of portions of the first and second embodiments of the infrared emitting device, respectively, according to the present invention.

Referring to FIG. 1a, there is shown a schematic diagram of a first embodiment of the infrared emitting device of the present invention. The infrared emitting device 10 comprises a III-V compound semiconductor substrate 12 upon which is grown a compound semiconductor active region 14.

The compound semiconductor substrate 12 preferably has a lattice constant, $a_0$, that is preferably greater than or equal to 6.0 angstroms at 300K. An InAs substrate may be used for embodiments of the invention in which quantum-well layers of the active region have a high As content (i.e. $InAs_xSb_{1-x}$ quantum-well layers with $0.5 \leq x < 1$). The InAs substrate may have, for example, a (001) crystallographic orientation. Compound semiconductor substrates other than InAs that satisfy the above preference for the lattice constant, $a_0$, may be used in connection with the present invention; and in particular GaSb substrates may be preferred for embodiments of the invention in which the $InAs_xSb_{1-x}$ quantum-well layers are slightly more Sb-rich (i.e. $x \leq 0.91$).

The active region 14 preferably comprises a plurality of semiconductor quantum-well layers 16 sandwiched between semiconductor barrier layers 18. The quantum-well layers 16 are formed from the ternary alloy InAsSb, with the quantum-well alloy composition and thickness chosen to provide a desired infrared emission wavelength in the range from about 2 to 6 microns. The semiconductor barrier layers 18 are formed from an alloy having a smaller lattice constant and a larger energy bandgap than the quantum-well layers 16. The barrier layers 18 may be, for example, formed from the ternary alloys InGaAs and InAlAs. The thicknesses of the quantum-well layers 16 and the barrier layers 18 may be about 5–20 nanometers to form a superlattice active region 14.

The active region 14 may be grown on the III-V semiconductor substrate 12 by epitaxial growth methods including metal-organic chemical vapor deposition (MOCVD), molecular beam epitaxy (MBE), or the like. A method for growing the epitaxial layers of the infrared emitting device 10 by MOCVD uses trimethylindium (TMIn), trimethylantimony (TMSb), and trimethylgallium (TMG), and arsine ($AsH_3$), respectively, as sources for In, Sb, Ga, and As for forming the ternary alloys InAsSb for the quantum-well layers 16 and InGaAs for the barrier layers 18. Hydrogen is used as a carrier gas with a total flow rate of about 6 standard liters per minute (SLM) and a growth pressure in the range of about 220 to 660 torr. Depending upon the particular ternary alloy layer composition to be grown by MOCVD, the III/V ratio may be varied over the range of about 3 to 10 and the growth temperature may be varied from about 475° C. to about 525° C., providing growth rates of about 0.75 to 3 microns per hour. With these MOCVD growth conditions, alternating barrier and quantum-well layers may be grown to form the active region 14 with a total thickness of about one micron or more. For electrically activated embodiments of the present invention having a semiconductor p-n or p-i-n junction therein, a cap layer (for example, an InGaAs or InAlAs barrier layer having a high In content) may be grown above the active region 14 in contact with an upper contact metallization 22.

To form an electrical p-n junction within the active region 14 when using an MOCVD epitaxial growth method, diethylzinc may be used as a source of Zn for p-type doping of a top portion (for example, about one-half) of the active region, with the remainder of the undoped (i.e. not intentionally doped) portion of the active region being n-type material (with a background carrier concentration of about 1 to $5 \times 10^{16} cm^{-3}$) or intentionally n-type doped with Sn, for example, at a concentration of about $1 \times 10^{17} cm^{-3}$. Other p-type dopants that may be used in forming a p-n or p-i-n junction by MOCVD and MBE include Cd and Be and compounds thereof; and n-type dopants including Sn, Se, Te, and Si and compounds thereof may be used for n-type doping of the epitaxial layers.

Figure 1B:
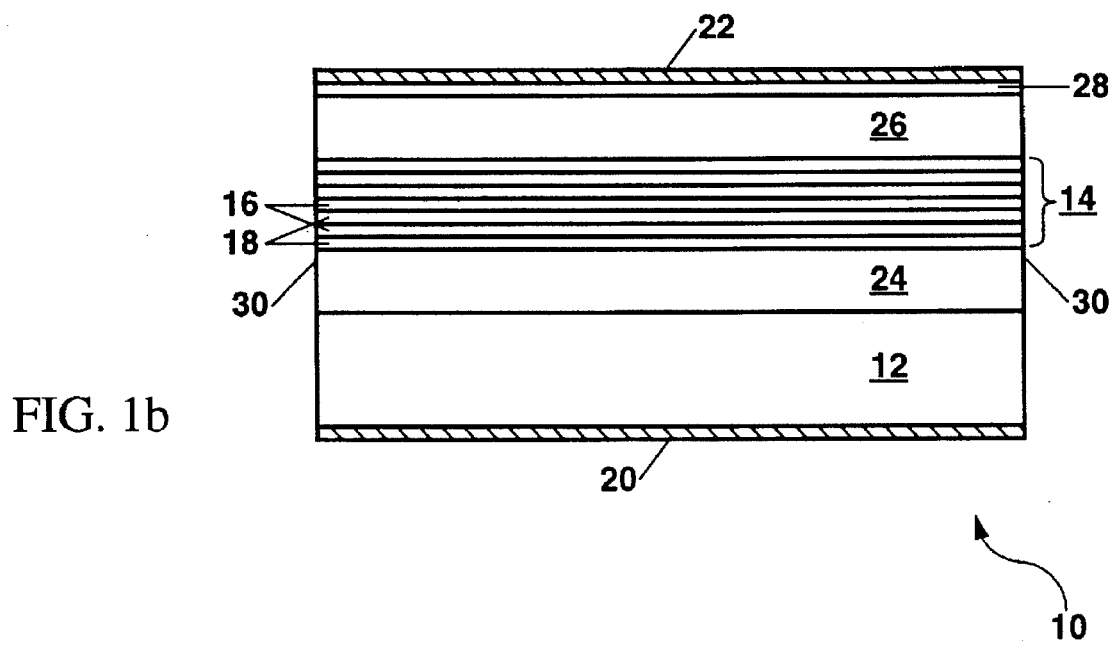

To maintain a good material quality for the epitaxially grown layers, the average lattice constant of the active region 14 may be matched (i.e. lattice matched) to that of the compound semiconductor substrate 12, with the active region 14 being grown directly on the substrate 12 as shown in FIG. 1a, or above a lower cladding layer 24 as shown in FIG. 1b. Alternately, a strain-relief buffer layer (about 1 micron thick) may be grown between the substrate 12 and the active region 14 to accommodate an active region 14 having an average lattice constant substantially different from that of the substrate 12.

To electrically contact the infrared emitting device 10, a lower contact metallization 20 is deposited on the bottom surface of the substrate 12, and an upper contact metallization 22 is deposited above the active region 14 (or above a cap layer 28 as shown in FIG. 1b). The lower and upper contact metallizations (20 and 22, respectively) may be Ti/Au or other n- and p-type metallizations as used with compound semiconductors. The upper contact metallization 22 is preferably patterned to define a device region therebelow for the generation and emission of infrared light in the infrared emitting device 10. In the LED embodiments of the invention, the upper contact metallization 22 may be, for example, an annular contact with an opening for the emission of the infrared light in a direction normal to a top surface of the upper contact metallization 22; whereas for edge-emitting LED and laser embodiments of the invention, the upper contact metallization 22 preferably defines a stripe contact with the infrared emission being in a direction parallel to the stripe contact. The infrared emitting device 10 may be attached to a heat sink for operation near room temperature or at a reduced temperature.

The flow of electrical current into the active region of an electrically-activated infrared emitting device 10 may be controlled and defined, for example, by etching a mesa structure into the active region 14, or by forming a patterned insulating layer above the active region 14 with an opening defining an annular or stripe region of electrical contact of the upper contact metallization 22 with the active region, or by selective ion implantation of portions of the active region outside the device region.

FIG. 1b shows a second embodiment of the infrared emitting device 10 according to the present invention. In FIG. 1b, the active region 14 is sandwiched between a lower cladding layer 24 and an upper cladding layer 26. The lower and upper cladding layers may have a uniform alloy composition throughout; or they may be comprised a plurality of sub-layers, each sub-layer being stepped or linearly graded in composition from adjacent sub-layers to form a separate-confinement heterostructure, or a graded-index separate-confinement heterostructure. The epitaxially-grown cladding layers (24 and 26) are formed of a ternary or quaternary compound-semiconductor alloy (for example, InPSb, AlAsSb, InPSbAs, AlGaAsSb, or AlGaInSb) having a smaller lattice constant and a higher energy bandgap than the barrier layers 18. The cladding layers act to increase the confinement of carriers (electrons and holes) and photons within the active region 14, thereby increasing the generation of the infrared light therein.

The ternary or quaternary alloy compositions and thicknesses of the upper and lower cladding layers may be the same or different, with the lower cladding layer 24 preferably being sufficiently thick to prevent a substantial absorption of the infrared light by the substrate 12. The lattice constants of the upper and lower cladding layers are preferably substantially equal to the lattice constants of the substrate 12 and active region 14 for a high-quality growth of the epitaxial layers of the infrared emitting device 10.

As an example, the upper and lower cladding layers each may be comprised of about 2 microns of the ternary alloy InP$_{0.65}$Sb$_{0.35}$ when the substrate is InAs and the active region comprises a 1.5-micron-thick InAs$_{0.87}$Sb$_{0.13}$/In$_{0.93}$Ga$_{0.07}$As strained-layer superlattice.

For the formation of an electrically-injected infrared emitting device 10, the lower cladding layer 24 is preferably doped with the same polarity (n- or p-type doping) as the substrate 12; and the upper cladding layer 26 has the opposite doping polarity. The active region 14 may be doped to form a p-n junction therein as discussed previously; or it may be undoped to form an intrinsic active region (i.e. a p-i-n junction). The same n- and p-type dopants discussed previously for the active region may also be used for the cladding layers (24 and 26). For the formation of an optically-pumped-laser infrared emitting device 10, a semiconductor junction is not required, and all the epitaxial layers may be left undoped (i.e. not intentionally doped).

In the second embodiment of the invention shown in FIG. 1b, the upper and lower cladding layers having a lower refractive index than the active region 14 provide optical waveguiding of the infrared light in the active region 14 in a direction parallel to the quantum-well layers 16. Such waveguiding action permits the formation of an edge-emitting LED; and optical waveguiding is essential for the formation of an efficient optically-pumped or electrically-injected laser embodiment of the invention.

Another essential element for the laser embodiments of the infrared emitting device 10 of the present invention is the formation of a resonant cavity providing optical feedback for lasing action. The resonant cavity may be formed, for example, by cleaving or etching a pair of reflecting end-facet mirrors 30 normal to the quantum-well layers on two opposite ends of the infrared emitting device 10 as shown in FIG. 1b. The reflecting mirrors 30 may be separated by about 100 microns or more to define a gain path in the active region 14 between the mirrors 30. The semiconductor/air interface formed by the reflecting mirrors may provide sufficient optical feedback for lasing; or one or both of the mirrors may be comprised of reflecting coatings (for example, deposited multi-layer dielectric coatings; or metal-over-dielectric coatings) to enhance the optical feedback for lasing.

Auger processes become increasingly important as the wavelength of infrared LEDs and lasers is increased, reducing the radiative efficiency of these devices and limiting their output as the operating temperature is increased. Auger processes are nonradiative recombination processes which can dominate radiative recombination to quench light emission from LEDs and lasers. For example, the Auger-1 (also termed CHCC) process in which an electron and a hole recombine by scattering a second electron up into the conduction band is the dominant Auger process near room temperature in extrinsic, n-type material. Auger processes in semiconductors are strongly thermally activated; and generally the Auger recombination rate, $R_A$, obeys an equation with a Boltzmann factor of the form:

$$R_A \propto n^3 \exp\left( \frac{-\mu E_T}{(1+\mu)kT} \right)$$

where n is an injected or photopumped electron or hole concentration in the active region 14, $E_T$ is an effective energy bandgap of a semiconductor material ($E_T$ is used herein to represent the energy bandgap, $E_{gap}$, for a bulk semiconductor, or the $1e$–$1h$ transition energy, $E_q$, for an SLS quantum-well layer of the active region), and $\mu = m_e^*/m_h^*$ is a ratio of the electron ($m_e^*$) and hole ($m_h^*$) effective masses in the semiconductor material, k is Boltzmann's constant, and T is the temperature of the semiconductor.

An Auger activation energy may be defined herein as:

$$\Delta E = \frac{\mu E_T}{(1+\mu)}$$

For narrow bandgap bulk III-V compound semiconductors $\mu \approx 0.05$ as, for example, in InAs. Thus the Auger activation energy, $\Delta E \approx 0.05 E_T$, may be about 0.02 eV (as in InAs) or smaller. The Auger activation energy may be smaller than the thermal energy kT at room temperature resulting in a high Auger recombination rate, $R_A$, which reduces the infrared emission and often prevents midwave infrared lasing action at room temperature.

Figure 2:
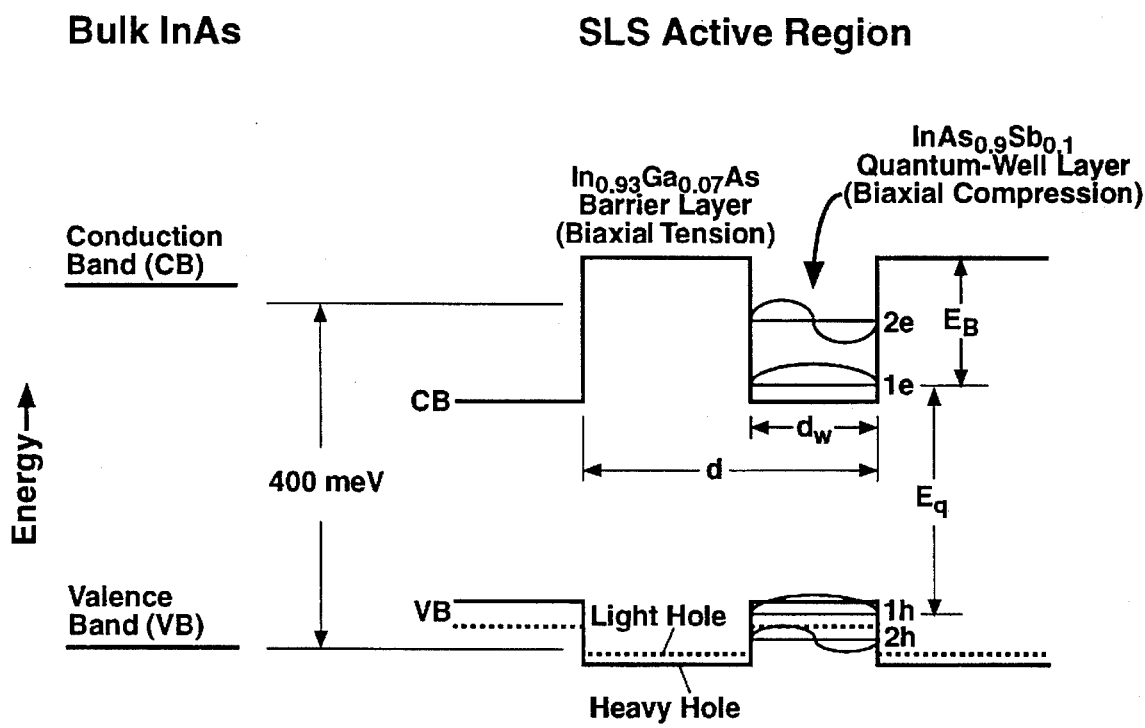
FIG. 2 shows estimated energy-band diagrams for a bulk InAs substrate and a strained-layer superlattice (SLS) active region comprising $InAs_{0.9}Sb_{0.1}$ quantum wells and $In_{0.93}Ga_{0.07}As$ barriers lattice matched to the InAs substrate according to the present invention.

Biaxial strain in a semiconductor layer may result in an effective mass, μ, in the two-dimensional plane of the layer that is different from the effective mass of the bulk semiconductor. Such biaxial strain may be introduced into the active region 14 by growing a strained-layer superlattice (SLS) active region as shown in the estimated energy band diagram of FIG. 2. In the example of FIG. 2, with an SLS active region 14 designed for a 4-micron infrared emitting device 10, the alloy compositions of the $InAs_{0.9}Sb_{0.1}$ quantum-well layers 16 and the $In_{0.93}Ga_{0.07}As$ barrier layers 18 provide different lattice constants for the quantum wells and barriers, with the average lattice constant of the active region 14 being substantially equal (i.e. lattice matched) to that of the bulk InAs substrate 12 whose energy level diagram is shown for comparison in FIG. 2. By growing an SLS active region 14, the quantum-well layers 16 may be compressively strained while the barrier layers 18 are tensile strained. Due to quantum confinement and compressive strain, the energy of light emitted from the quantum-well layers 16 (i.e. $E_q$ in FIG. 2) is slightly greater than the energy bandgap of an unstrained bulk alloy having the same alloy composition. The effect of the biaxial strain in the active region is to split the degeneracy of the valence bands (i.e. to split the valence band into light hole and heavy hole bands as shown in FIG. 2), thereby substantially increasing the Auger activation energy, $\Delta E$.

Figure 3:
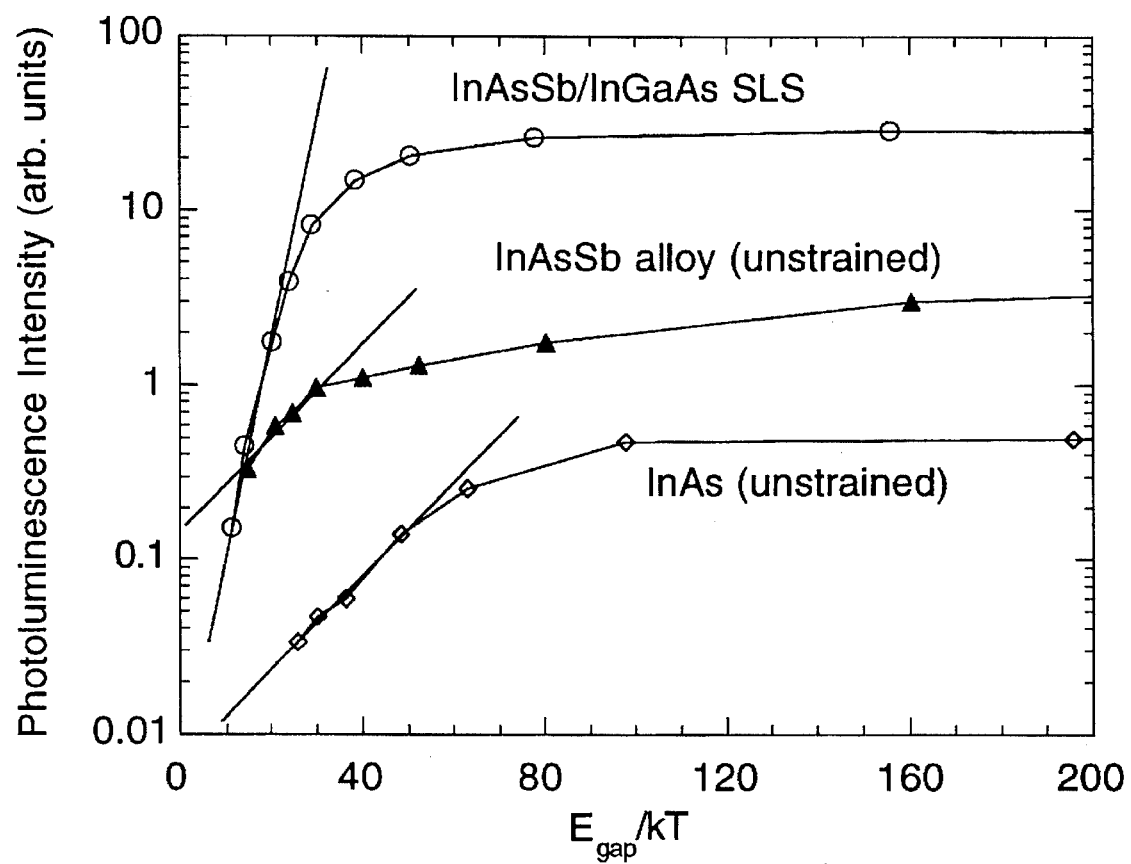
FIG. 3 shows the increased photoluminescence intensity of an InAsSb/InGaAs strained-layer superlattice (SLS) active region according to the present invention.

A theoretical calculation of an SLS active region 14 comprising 9 nanometer thick biaxially compressively strained $InAs_{0.91}Sb_{0.09}$ quantum-well layers and 13 nanometer thick $In_{0.87}Ga_{0.13}As$ biaxially tensile strained barrier layers, for example, shows a calculated effective mass ratio, $\mu$, in the quantum wells of 0.55 as compared with a value of about 0.06 for either a bulk $InAs_{0.94}Sb_{0.06}$ layer or a bulk InAs layer. The effect of the biaxial compressive strain in increasing the effective mass ratio in the quantum wells has been confirmed experimentally by measuring the temperature dependence of the photoluminescence intensity (i.e. the photoluminescence efficiency) of a strained-layer superlattice of the above alloy compositions and comparing it to unstrained bulk semiconductors (InAs and $InAs_{0.94}Sb_{0.06}$). These results in FIG. 3 show that at the lowest temperatures (<100K), the photoluminescence intensities are relatively insensitive to temperature and are controlled by defect-related processes. However, for temperatures in the range of 100 to 300K, the temperature dependence of the photoluminescence from the SLS InAsSb/InGaAs active region shows a measured Auger activation energy of $\Delta E = 0.26 E_q$ (where $E_q$ is the $1e-1h$ transition energy of the emitted infrared light in FIG. 2), corresponding to a value of $\mu=0.35$. For the unstrained bulk InAs and $InAs_{0.94}Sb_{0.06}$, the measured Auger activation energies are both about $\Delta E = 0.06 E_q$, corresponding to $\mu = 0.06$.

From the exponential nature of the Auger recombination rate, an increase in the effective mass ratio and Auger activation energy of compressively strained quantum wells in the active region 14 results in a substantial reduction in the Auger recombination rate, $R_A$, and a substantial improvement in the infrared light emission efficiency (which is proportional to $R_A^{-1}$), allowing an infrared emitting device 10 with biaxially compressively strained quantum wells to operate at higher temperatures and with higher infrared light emission powers (i.e. output powers) than otherwise may be possible.

In fabricating an efficient infrared emitting device 10, a method for providing an active region structure, in which the effect of a dominant Auger-1 process is reduced, is set forth below. This method establishes a preferred quantum-well layer thickness for the active region 14 to increase the Auger-1 activation energy, $\Delta E$, thereby improving the infrared emission power and the temperature dependence of the infrared emitting device 10.

As previously discussed, the active region 14 preferably comprises a strained-layer superlattice having biaxially compressively-strained quantum-well layers 16 and biaxially tensile-strained barrier layers 18. For a given periodicity, d, of the strained-layer superlattice active region (d is defined herein as the combined thickness of one quantum-well layer 16 and one barrier layer 18 as shown in FIG. 2), the preferred thickness, $d_w$, of each of the quantum-well layers 16 may be determined from the method presented herebelow. The method is general in nature and may be applied to any active region 14 comprising biaxially strained quantum-wells and barrier layers formed from any III-V alloy, including ternary and quaternary alloys.

From a three-dimensional theoretical analysis using a tight binding representation of the miniband of quantum confinement states in the quantum well layers, the thickness, $d_w$, of the quantum well layers 16 is determined to preferably be:

$$d_w \leq d_{1e,\mathit{eff}} < \frac{d}{2}$$

where $d_{1e,\mathit{eff}}$ is an effective width of an isolated quantum confinement wavefunction in a quantum well approximated by:

$$d_{1e,\mathit{eff}} = d_w + 2\left(\frac{2m_{e,B}^* E_B}{\hbar^2}\right)^{-\frac{1}{2}}$$

In the above equation derived for $d_{1e,\mathit{eff}}$, $m_{e,B}^*$ is the effective mass of an electron in a barrier layer 18, $E_B$ is the binding energy of $1e$ electron energy state in the quantum well 16 (as shown in FIG. 2), and $\hbar = h/2\pi$ where h is Planck's constant.

To summarize, the method according to the present invention for fabricating an infrared emitting device 10 to reduce the Auger-1 recombination, comprises the steps of epitaxially growing upon a compound semiconductor substrate an active region 14 in the form of a strained-layer superlattice having biaxially compressively-strained quantum-well layers and biaxially tensile-strained barrier layers. The above method includes a further step of selecting a thickness for the quantum-well layers that satisfies the above equation for $d_w$.

Other considerations that may help in determining a minimum preferable value for the thickness of the quantum-well layers 16 are presented herebelow. The minimum preferable thickness for $d_w$ may be chosen sufficiently small within the constraint of the above equation for $d_w$ to provide an energy separation of about 2 kT to 4 kT (where k is the Boltzmann constant) for the $1e-2e$ electron energy states in the conduction band of the quantum-well layers to reduce the possibility for thermally populating the $2e$ energy state near room temperature, thereby preventing the occurrence or turn-on of additional scattering processes (other than the Auger-1 process).

The infrared emitting device and method of the present invention may be further understood with the aid of several examples as presented below. These examples are for the purpose of illustration only; and in no way are they intended to limit the invention. Other applications and variations of the infrared emitting device and method will become evident to those skilled in the art according to the teaching of the present invention.

EXAMPLE 1

A first example of the infrared emitting device 10 is in the form of an electrically injected light emitting diode having an epitaxial structure as shown in FIG. 1a with a semiconductor p-n junction formed therein. The LED, grown by MOCVD on an n-type InAs substrate 12, comprises a strained-layer superlattice active region 14 having a plurality of 11-nanometer-thick compressively-strained $InAs_{0.91}Sb_{0.09}$ quantum-well layers 16 and a plurality of 11.6-nanometer-thick tensile-strained $In_{0.87}Ga_{0.13}As$ barrier layers 18. (X-ray analysis may be used for an accurate determination of alloy compositions and layer thicknesses.) The total thickness of the SLS active region is about 3 microns, with the lower 2 microns of the active region being undoped (i.e. not intentionally doped) and n-type, and the upper 1 micron being p-doped (about $5\times10^{17}$ cm$^{-3}$ Zn). The active region in this first example of the invention has an average lattice constant slightly different from the lattice constant of the InAs substrate, resulting in a lattice mismatch parameter $\Delta a/a_0=0.006$ (where $\Delta a$ is the difference between the active region average lattice constant and the substrate lattice constant, $a_0$).

The LED 10 in this first example of the invention has an unpassivated circular mesa structure having a diameter of about 300 microns. An annular patterned upper contact metallization 22 having an opening of about 200 microns diameter therein provides for emission of the infrared light in a direction normal to the top surface of the metallization 22.

Figure 4:
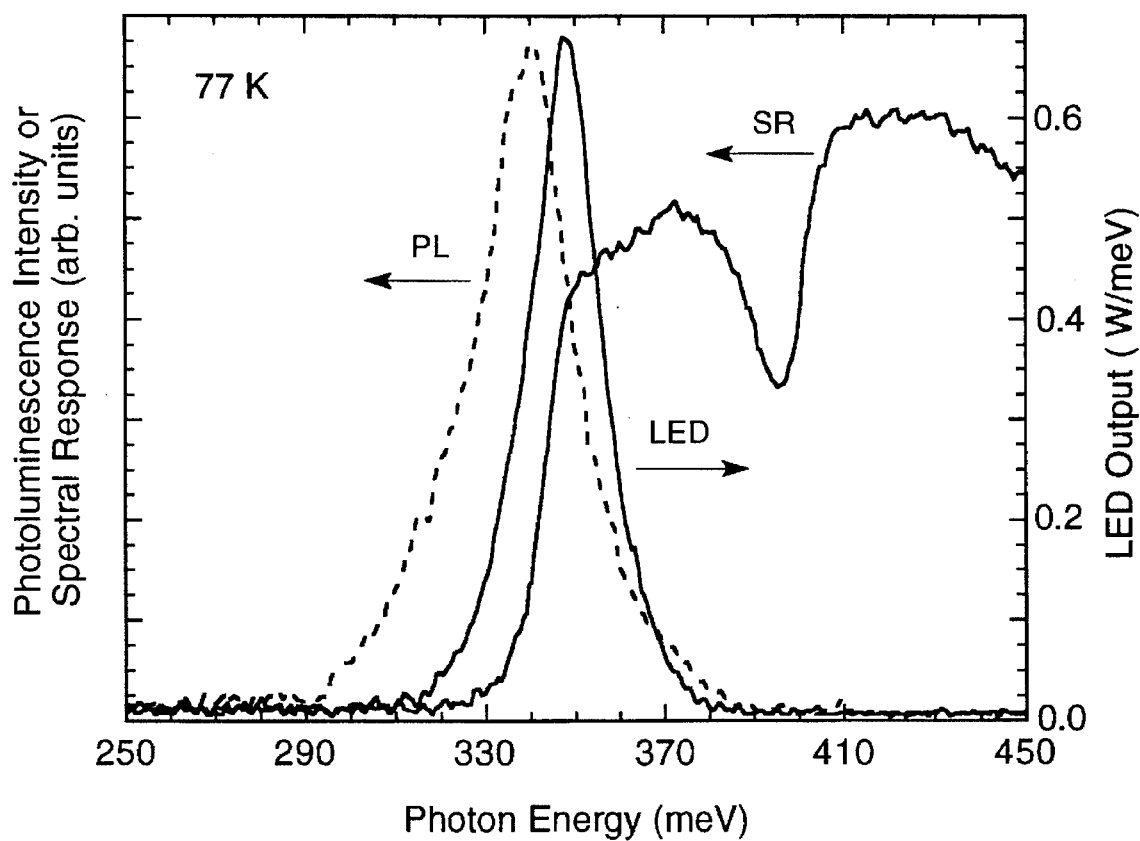
FIG. 4 shows spectral characteristics and output power at 77K of an infrared light emitting diode according to a first example of the invention.

FIG. 4 shows the spectral distribution of the infrared emission output of the LED 10 at a temperature of 77K for forward-bias current of 100 mA. The LED emission is centered at an infrared energy of about 348 meV (corresponding to an emission wavelength of 3.56 microns) as measured with a Fourier transform infrared spectrometer equipped with an InSb detector. The integrated infrared light output power (i.e. the output power integrated over the range of emission energies in FIG. 4) at 77K for the LED is about 0.02 W/cm$^2$ at a current density of about 100 A/cm$^2$, resulting in an external quantum efficiency of about 0.06%. It is expected that the external quantum efficiency may be further improved by growing an active region 14 that is better lattice matched to the substrate 12.

FIG. 4 also shows the photoluminescence (PL) spectrum (with Nd:YAG laser excitation at 1.06 microns) and the photovoltaic spectral responsivity (SR) of the infrared emitting device 10. The peak of the photoluminescence spectrum and the onset energy for the photovoltaic response both occur at about the same energy, about 340 meV. The shift of the LED emission to a slightly higher energy may be due to band filling.

Figure 5:
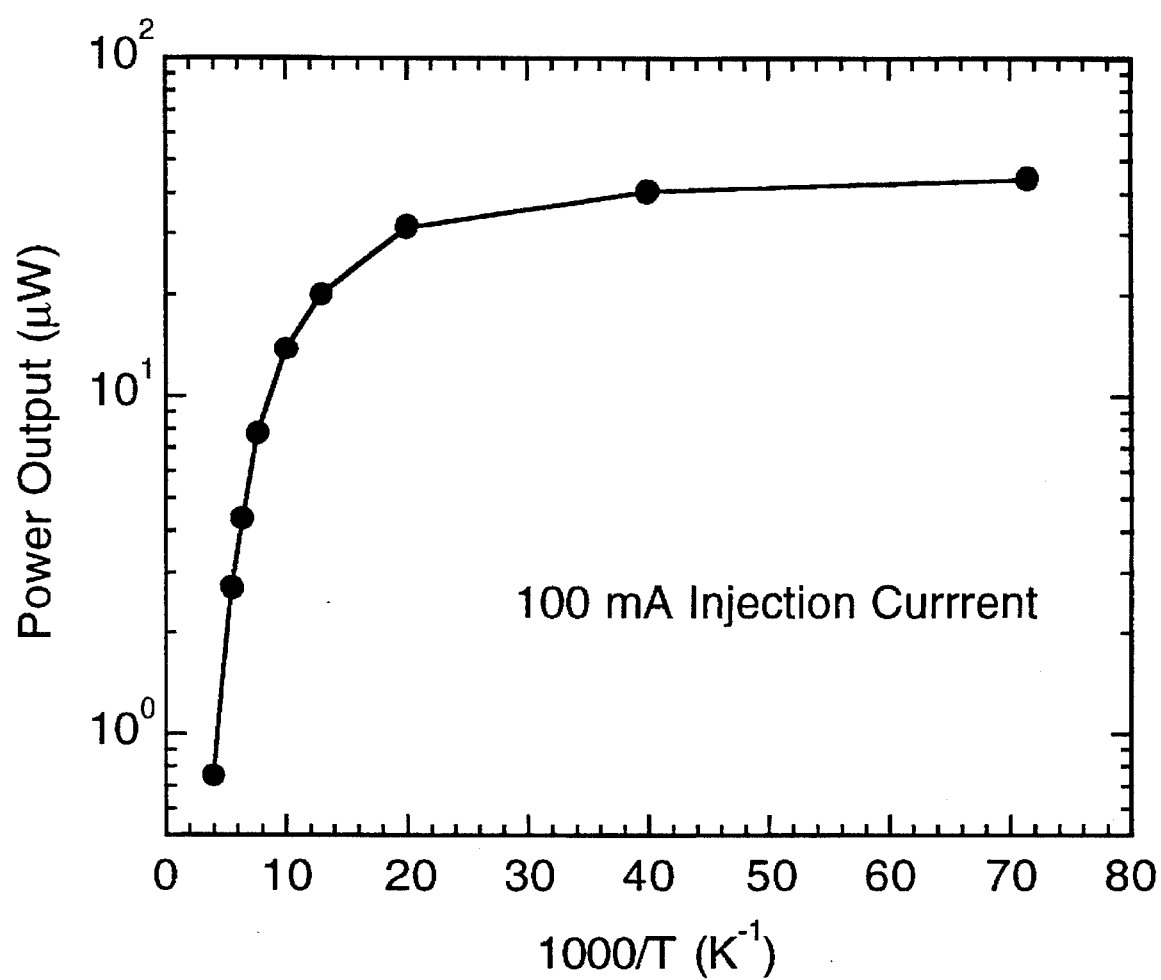
FIG. 5 shows the inverse temperature dependence of the integrated output power from the infrared light emitting diode of FIG. 4.

FIG. 5 shows the temperature dependence of the integrated output power for the above LED example of the present invention. As shown in FIG. 5, the inverse temperature dependence of the integrated output power is similar to that shown in FIG. 3 for the photoluminescence of the biaxially strained InAsSb/InGaAs SLS active region having the same alloy compositions but different layer thicknesses.

Molecular beam epitaxy (MBE) may be used to fabricate LEDs similar to this first example of the invention with comparable midwave infrared emission characteristics to those in FIGS. 4 and 5.

EXAMPLE 2

Figure 6:
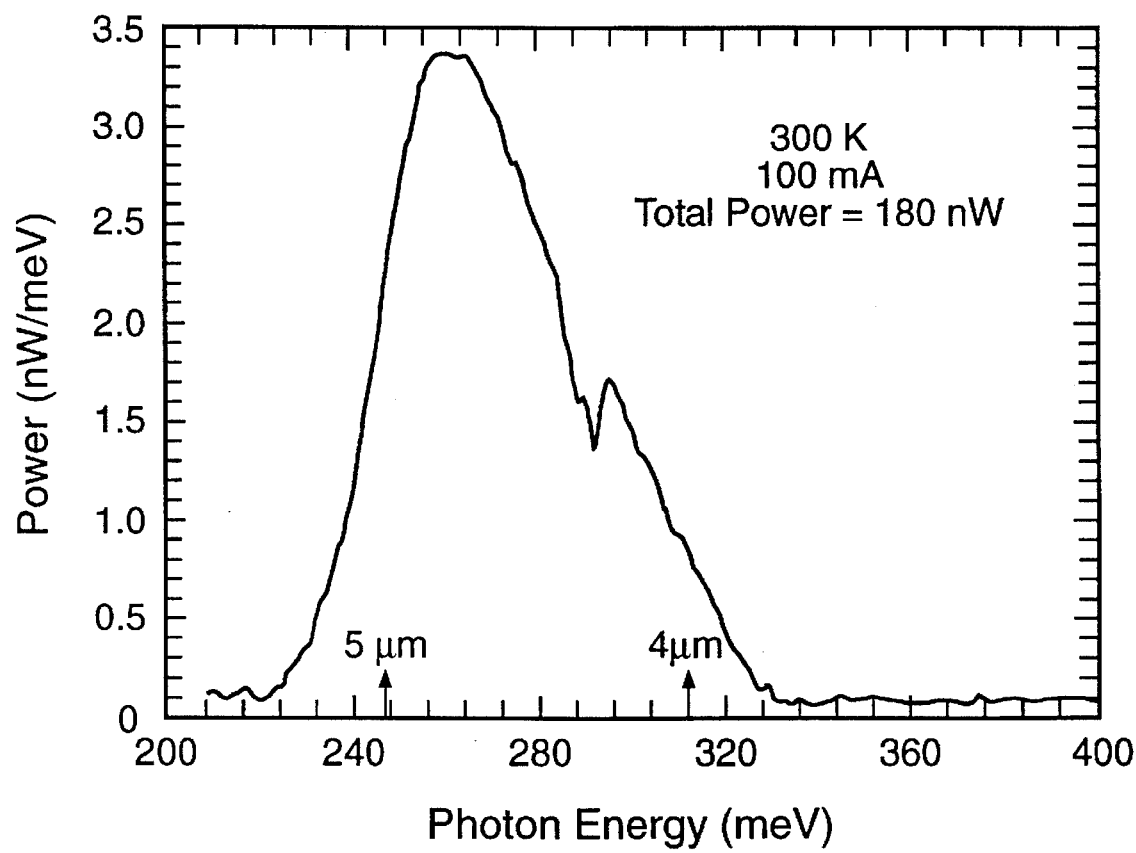
FIG. 6 shows the output power spectrum at 300K for an infrared light emitting diode according to a second example of the invention.

FIG. 6 shows the output power spectrum at room temperature (300K) for an infrared LED 10 according to a second example of the invention. This second LED, also grown by MOCVD on an n-type InAs substrate 12, comprises a strained-layer superlattice active region 14 having a plurality of 7.5-nanometer-thick compressively-strained $InAs_{0.9}Sb_{0.1}$ quantum-well layers 16 and 15-nanometer-thick tensile-strained $In_{0.95}Ga_{0.05}As$ barrier layers 18. The active region 14 in this second example of the invention is about 1.5 microns thick and undoped (i.e. not intentionally doped). The active region 14 is sandwiched between a lower cladding layer 24 and an upper cladding layer 26, with the cladding layers and active region all being lattice matched to the substrate. The lower cladding layer 24 comprises a 2 micron thick layer of $InP_{0.65}Sb_{0.35}$ having an n-type doping (with Sn as the n-dopant at about $1-5\times10^{17}$ cm$^{-3}$). The upper cladding layer 26 comprises a 0.5 micron thick layer of $InP_{0.65}Sb_{0.35}$ having a p-type doping (with Zn as the p-dopant at about $1-2\times10^{17}$ cm$^{-3}$).

In FIG. 6 this second LED, when operating at 300K, is a source of infrared light emission over the wavelength range of about 4 to 5 microns, with a center emission wavelength near 4.7 microns. With an unpassivated mesa structure similar to that of the first example of the invention, the total integrated output power for this second LED example at 300K is about 180 nanoWatts (nW) at 100 mA current. Higher output powers may be realized by utilizing the waveguiding properties of the cladded active region to fabricate infrared edge-emitting LEDs with the epitaxial layer structure of this second example of the invention.

EXAMPLE 3

A third example of an infrared emitting device 10 according to the present invention is an optically-pumped laser having a pair of cleaved end-facet mirrors 30. The SLS active region 14 for the optically-pumped midwave infrared laser 10 is 1.5 microns thick and is comprised of 9.5-nanometer-thick compressively-strained $InAs_{0.87}Sb_{0.13}$ quantum-well layers and 13.3-nanometer-thick tensile-strained $In_{0.93}Ga_{0.07}As$ barrier layers grown by MOCVD on an InAs substrate 12. The SLS active region 14 is grown above a lower cladding layer 24, with the cladding layer and active region being lattice matched to the substrate. The lower cladding layer 24 comprises a 2-micron-thick undoped (i.e. not intentionally doped) layer of $InP_{0.65}Sb_{0.35}$. A 10-nanometer-thick undoped $InP_{0.65}Sb_{0.35}$ cap layer 28 is grown above the active region 14 to reduce surface recombination of the optically generated electron-hole pairs. For optical pumping of the laser 10, no metallization layers are required.

The epitaxially grown wafer is mechanically thinned and cleaved into bars of optically-pumped lasers 10 with each bar providing a resonant cavity having a length of about 100 microns or more with cleaved end-facet mirrors 30. The laser 10 is optically pumped, for example, with a Ti-sapphire laser emitting about 1.5 milliJoule pulses at about 825 nanometers wavelength with a pulse width of about 30 nanoseconds and a pulse repetition rate of about 1 kHz. The pump beam from the Ti-sapphire laser is preferably focused with a cylindrical lens on a top surface (i.e. the top surface of the cap layer) of the laser 10 with the focused light being aligned in a direction perpendicular to the cleaved end-facet mirrors 30. The optically-pumped laser 10 may be pressed into indium metal under a thin (about 0.5 millimeter thick) sapphire window to provide heat sinking for the laser 10. Alternately, the means for optically pumping the active region 14 may include one or more semiconductor diode lasers or diode laser arrays having an optical pump energy larger than the 1e–1h transitiion energy, Eq.

Figure 7:
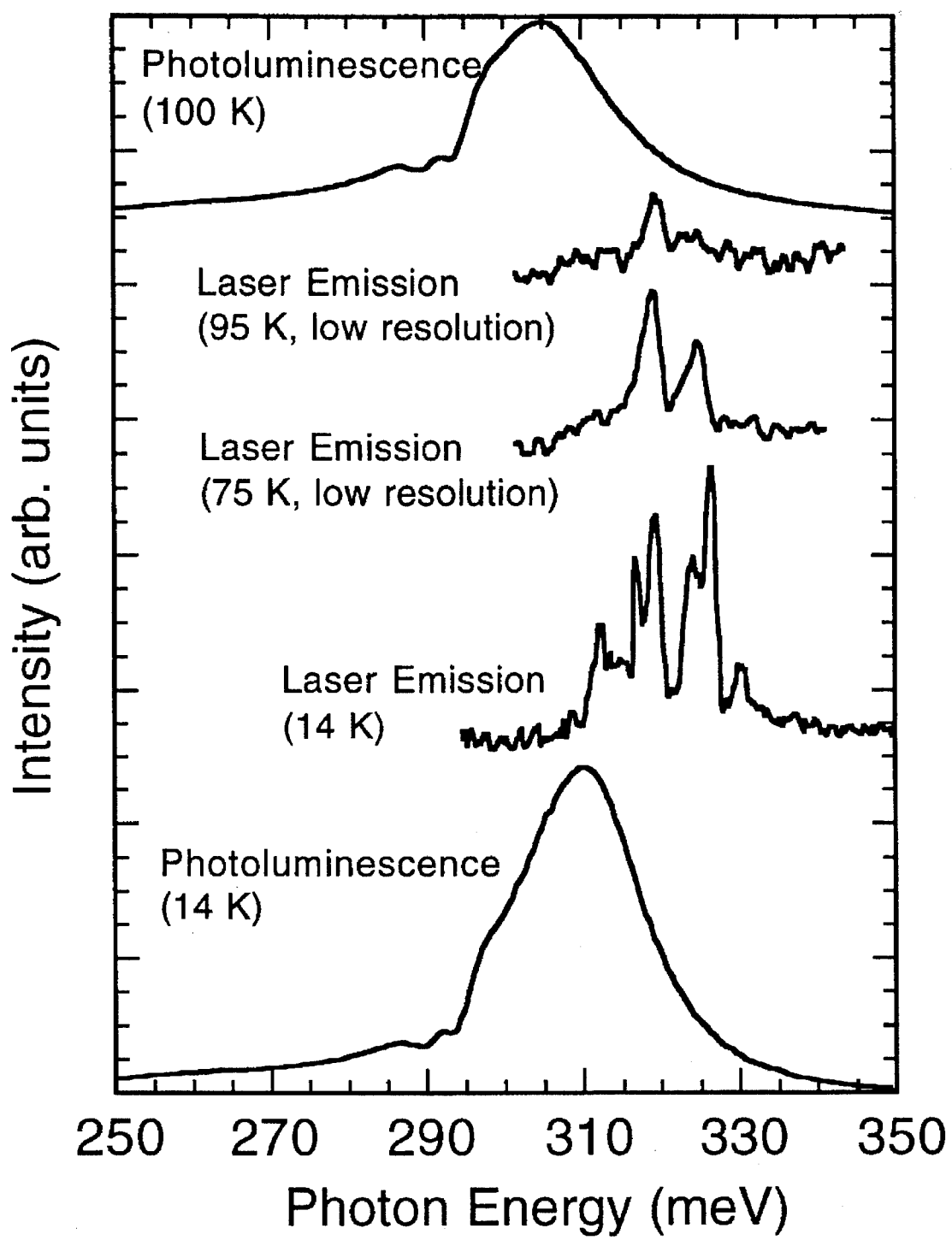
FIG. 7 shows the photoluminescent and lasing spectra for an optically-pumped infrared laser according to a third example of the invention.

FIG. 7 shows the lasing and photoluminescence spectra measured for the optically-pumped laser 10 for various temperatures. The lasing emission occurs at a wavelength of about 320 meV corresponding to an infrared wavelength of about 3.9 microns. Lasing action in this third example of the invention occurs at temperatures up to about 110K.

EXAMPLE 4

The epitaxial layer structure of this third example of the invention may be modified to provide an electrically-injected diode laser embodiment of the invention. For a diode laser 10, an upper cladding layer is preferably grown above the active region 14 as shown in FIG. 1b. The lower cladding layer doped n-type when the substrate is n-type, and the upper cladding layer is oppositely doped (i.e. p-type). The active region may be either undoped (i.e. not intentionally doped) to form a p-i-n diode junction; or it may be doped to form a p-n junction therein. The diode junction polarity is aligned to the polarity of the adjacent cladding layers (i.e. the p-doped portion of the active region is adjacent to the p-doped cladding layer and the n-doped portion of the active region is adjacent to the n-doped cladding layer). Lower and upper contact metallizations (20 and 22, respectively) are applied to the epitaxially grown wafer which may be thinned prior to metallization to about 100–200 microns thickness. The upper contact metallization may be patterned to define the width of the laser, with the stripe metallization being, for example, about 5 to 100 microns wide. The diode laser 10 may be further defined by etching a ridge waveguide structure into the upper cladding layer 26 (i.e. by etching partially through the upper cladding layer 26 on each side of the stripe upper contact metallization 22) to define an index-guided diode lair 10. Alternately, a gain-guided diode laser 10 may be defined by a patterned insulating layer having stripe openings therein (aligned in a lasing direction) between the upper cladding layer 26 and the upper contact metallization 22, or by implanting ions into the upper cladding layer 26 on each side of the stripe upper contact metallization 22. The resonant cavity comprising end-facet mirrors 30 may then be formed by an etching or cleaving process.

There has thus been shown an infrared emitting device that comprises a III-V compound semiconductor substrate upon which are grown a quantum-well active region having a plurality of quantum-well layers formed of a ternary alloy comprising InAsSb sandwiched between barrier layers formed of a ternary alloy having a smaller lattice constant and a larger energy bandgap than the quantum-well layers. The quantum-well layers are preferably compressively strained to increase the threshold energy for Auger recombination; and a method is provided for determining the preferred thickness for the quantum-well layers. Embodiments of the present invention are described having at least one cladding layer to increase the optical and carrier confinement in the active region, and to provide for waveguiding of the light generated within the active region. Examples have been set forth showing embodiments of the present invention as surface- and edge-emitting light emitting diodes (LEDs), an optically-pumped semiconductor laser, and an electrically-injected semiconductor diode laser. The light emission from each of the infrared emitting devices of the present invention is in the midwave infrared region of the spectrum from about 2 to 6 microns.

The matter set forth in the foregoing description and accompanying drawings is offered by way of illustration only and not as a limitation. Other applications and variations of the IOC package and method will become evident to those skilled in the art. The actual scope of the invention is intended to be defined in the following claims when viewed in their proper perspective based on the prior art.

What is claimed is:

1. A method for forming an infrared light emitting device comprising the step of epitaxially growing upon a compound semiconductor substrate a semiconductor active region comprising a strained-layer superlattice having a plurality of compressively-strained quantum-well layers comprising a ternary alloy of the following elements InAsSb separated by a plurality of tensile-strained barrier layers formed of a compound semiconductor alloy having a smaller lattice constant and a larger energy bandgap than the quantum-well layers, in which the quantum-well layers have a thickness, $d_w$, that satisfies an equation of the form $d_w \leq d_{1e,\mathit{eff}} < d/2$ for substantially reducing an Auger recombination process in the active region.

2. The method of claim 1 in which the quantum-well layer thickness provides an energy separation near room temperature of about 2kT to 4kT between a first energy state and a second energy state in a conduction band of the quantum-well layers.

3. An infrared emitting device comprising:

(a) a compound semiconductor substrate having a lattice constant of at least 6.0 angstroms; and (b) a semiconductor active region grown above the substrate and comprising a plurality of quantum-well layers separated by barrier layers, each quantum-well layer being formed of a ternary alloy of InAsSb and having a thickness, $d_w$, satisfying an equation of the form $d_w \leq d_{1e,\mathit{eff}} < d/2$ for substantially reducing an Auger recombination process in the active region, and each barrier layer being formed of a compound semiconductor alloy having a smaller lattice constant and a larger energy bandgap than the quantum-well layers.

4. The infrared emitting device of claim 3 wherein the thickness, $d_w$, of the quantum-well layers provides an energy separation near room temperature of about 2kT to 4kT between a first energy state and a second energy state in a conduction band of the quantum-well layers.

5. The infrared emitting device of claim 3 wherein the barrier layers comprise InGaAs or InAlAs.

6. The infrared emitting device of claim 3 wherein the substrate comprises InAs or GaSb.

7. The infrared emitting device of claim 3 in the form of a light-emitting diode.

8. The infrared emitting device of claim 3 in the form of a semiconductor laser.

\* \* \* \* \*